United States Patent
Che et al.

(10) Patent No.: US 7,361,415 B2
(45) Date of Patent: Apr. 22, 2008

(54) SYSTEM AND METHOD FOR PRODUCING LIGHT WITH ORGANIC LIGHT-EMITTING DEVICES

(75) Inventors: Chi-Ming Che, Hong Kong (CN); Siu-Chung Chan, Hong Kong (CN)

(73) Assignee: The University of Hong Kong, Hong Kong (HK)

( * ) Notice: Subject to any disclaimer, the term of this patent is extended or adjusted under 35 U.S.C. 154(b) by 413 days.

(21) Appl. No.: 10/825,231

(22) Filed: Apr. 16, 2004

(65) Prior Publication Data
US 2005/0233167 A1    Oct. 20, 2005

(51) Int. Cl.
*B32B 19/00* (2006.01)
*H01J 63/04* (2006.01)
(52) U.S. Cl. ............... 428/690; 428/917; 313/112; 313/504; 313/506; 556/32; 556/146
(58) Field of Classification Search ............ 428/690, 428/917; 313/504, 506, 112; 556/32, 137, 556/146; 257/E51.041, E51.044
See application file for complete search history.

(56) References Cited

U.S. PATENT DOCUMENTS 3,963,708 A * 6/1976 L'Eplattenier et al. ...... 549/210

(Continued)

FOREIGN PATENT DOCUMENTS

JP       406033050 A  *  2/1994

(Continued)

OTHER PUBLICATIONS

Adachi, et al., "High-efficiency organic electrophosphorescent devices with tris(2-phenylpyridine)iridium doped into electron-transporting materials" *Appl. Phys. Lett.*, 77(6):904-6 (2000).

(Continued)

*Primary Examiner*—Jill Gray
(74) *Attorney, Agent, or Firm*—Dickstein Shapiro LLP

(57) ABSTRACT

Disclosed are emissive materials of formula (I) or (II), comprising two bidentate NO-type ligands, or a tetradentate NOON-type ligand, and a transition metal. The emissive materials are useful as electrophosphorescent emitters in organic light-emitting devices. Also disclosed are methods for preparing organic light-emitting diodes comprising these emissive materials, and the use of such diodes as white and yellow organic light-emitting devices.

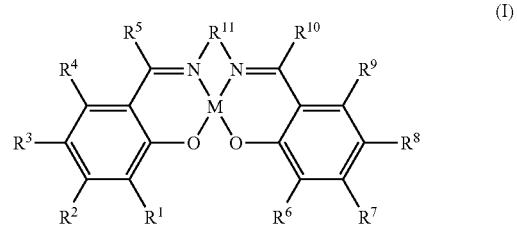

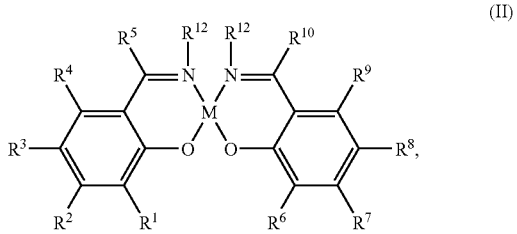

20 Claims, 7 Drawing Sheets

Schematic diagram of OLED in present invention

Electroluminescence

U.S. PATENT DOCUMENTS

| | | | | |
|---|---|---|---|---|
| 4,008,225 | A | * | 2/1977 | L'Eplattenier et al. ....... 544/225 |
| 4,861,904 | A | * | 8/1989 | Sugie ............................ 556/32 |
| 5,432,014 | A | * | 7/1995 | Sano et al. .................. 428/690 |
| 5,755,999 | A | * | 5/1998 | Shi et al. ................ 252/301.16 |
| 6,048,630 | A | | 4/2000 | Burrows et al. |
| 6,310,360 | B1 | | 10/2001 | Forrest et al. |
| 6,515,298 | B2 | | 2/2003 | Forrest et al. |
| 6,579,633 | B2 | * | 6/2003 | Kim et al. ................... 428/690 |
| 6,653,654 | B1 | * | 11/2003 | Che .............................. 257/40 |
| 6,800,380 | B2 | * | 10/2004 | Lee et al. .................... 428/690 |
| 6,991,857 | B2 | * | 1/2006 | Tsuboyama et al. ......... 428/690 |
| 2002/0182441 | A1 | | 12/2002 | Lamansky et al. |
| 2002/0197511 | A1 | | 12/2002 | D'Andrade et al. |
| 2003/0054198 | A1 | * | 3/2003 | Tsuboyama et al. ......... 428/690 |
| 2006/0068222 | A1 | * | 3/2006 | Kitamura et al. ............ 428/690 |
| 2006/0210828 | A1 | * | 9/2006 | Nakayama et al. .......... 428/690 |

FOREIGN PATENT DOCUMENTS

| | | | |
|---|---|---|---|
| JP | 2003123981 | * | 4/2003 |
| JP | 2004256612 A | * | 9/2004 |
| JP | 2006140059 A | * | 6/2006 |
| WO | WO-00/57676 | | 9/2000 |
| WO | WO-02/091814 A2 | | 11/2002 |
| WO | WO 2004096755 A1 | * | 11/2004 |
| WO | WO 2004096946 A1 | * | 11/2004 |

OTHER PUBLICATIONS

Adamovich, et al, "High efficiency single dopant white electrophosphorescent light emitting diodes," *New J. Chem.*, 26:1171-8 (2002).

D'Andrade, et al, "Controlling Exciton Diffusion in Multilayer White Phosphorescent Organic Light Emitting Devices," *Adv. Mater.*, 14(2):147-51 (2002).

Baldo, et al., "Highly efficient phosphorescent emission from organic electroluminescent devices," *Nature*, 395:151-4 (1998).

Baldo, et al., "Very high-efficiency green organic light-emitting devices based on electrophosphorescence," *Appl. Phys. Lett.*, 75(1):4-6 (1999).

Duggal, et al., "Organic light-emitting devices for illumination quality white light," *Appl. Phys. Lett.*, 80(19):3470-2 (2002).

Ho, et al., "A blue photoluminescent $[Zn(L)(CN_2)](L=2,2'$-dipyridylamine) material with a supramolecular one-dimensional chain structure," *Chem. Commun.*, 2101-2 (1998).

Huang, et al., "High-efficieny white organic light-emitting devices with dual doped structure," *App. Phys. Lett.*, 80(15):2782-4 (2002).

Kawamura, et al., "Energy transfer in polymer electrophosphorescent light-emitting devices with single and multiple doped luminescent layers," *J. Appl. Phys.*, 92(1):87-93 (2002).

Kido, et al., "Multilayer White Light-Emitting Organic Electroluminescent Device," *Science*, 267:1332-4 (1995).

Ko, et al., "Bright white organic light-emitting diode," *Appl. Phys. Lett.*, 79(25):4234-6 (2001)

Lamansky, et al., "Highly Phosphorescent Bis-Cyclometalated Iridium Complexes: Synthesis, Photophysical Characterization, and Use in Organic Light Emitting Diodes," *J. Am. Chem. Soc.*, 123(18):4304-12 (2001).

Lamansky, et al., "Molecularly doped polymer light emitting diodes utilizing phosphorescent Pt(II) and Ir(III) dopants," *Organic Electronics*, 2:53-62 (2001).

Lin, et al., "Structural, Photophysical, and Electrophosphorescent Properties of Platinum(II) Complexes Supported by Tetradentate $N_2O_2$ Chelates," *Chem. Eur. J.*, 9(6):1264-72 (2003).

Lu, et al., "$[(CN^{N)Pt(C=C)}_n R][HCNN$=6-aryl-2,2'bipyridine, n=1-4, R=aryl, $SiMe_3$) as a new class of light-emitting materials and their applications in electrophosphorescent devices," *Chem. Commun.*, 206-7 (2002).

Ma, et al., "a blue electroluminescent molecular device from a tetranucluear zinc(II) compound $[Zn_4O(AID)_6]$ (AID=7-azaindolate)," *Chem. Commun.*, 2491-2 (1998).

Ma, et al., "Light-emitting diode device from a luminescent organocopper(I) compound," *New J. Chem.*, 263-5 (1999).

Ma, et al., "Triplet luminescent dinuclear-gold(*I*) complex-based light-emitting diodes with low turn-on voltage," 74(10):1361-3 (1999).

Thompson, et al., "White light emission from blends of blue-emitting organic molecules: A general route to the white organic light-emitting diode?," *Appl. Phys. Lett.*, 79(5):560-2 (2001).

Xie, et al., "Reduction of Self-Quenching Effect in Organic Electrophosphorescence Emitting Devices via the Use of Sterically Hindered Spacers in Phosphorescence Molecules," *Adv. Mater.*, 13(16):1245-8 (2001).

Ardasheva, et al., "Concentration and Aggregationn Effects on Luminescence Properties of Pt(II) Complexes with N,N-Bis-(salicylidene)-1,3-propanediamine," *Russian State Pedagogical University*, May 5, 1997.

Vlasov, et al., "New method of determining the activity coefficients of electrolytes from extraction data," *Rus. Jour. Phys. Chem.*, 65(11):1536 (1991).

\* cited by examiner

FIG. 1. TGA thermograms of dopant complexes 1-3.
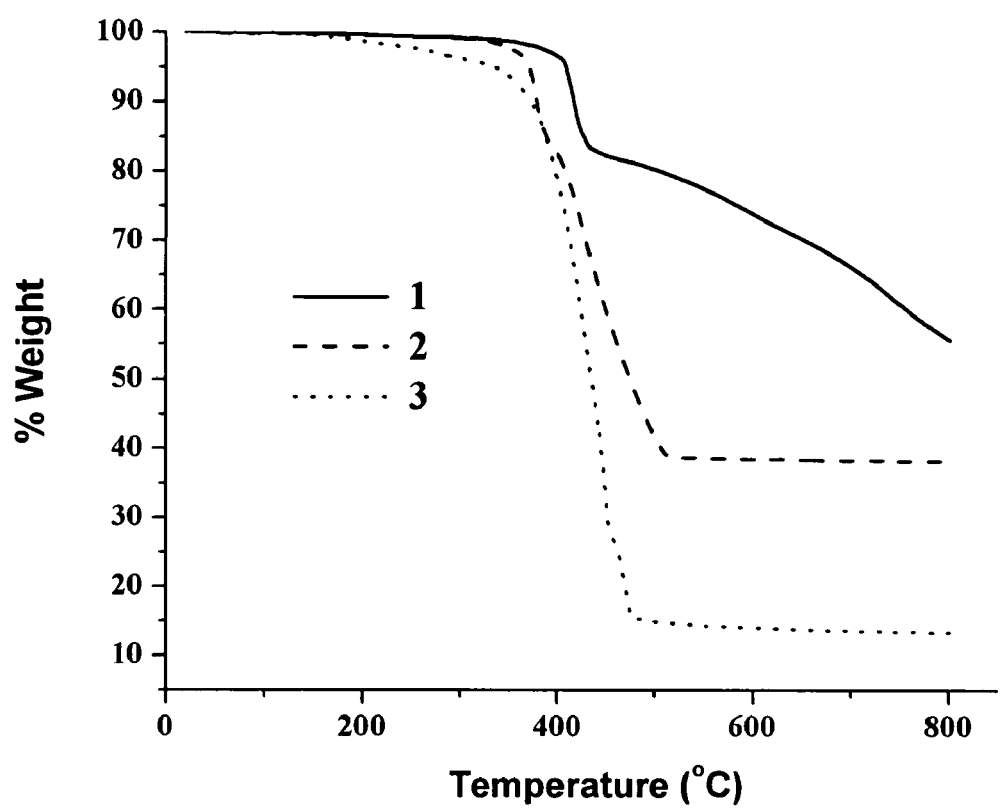

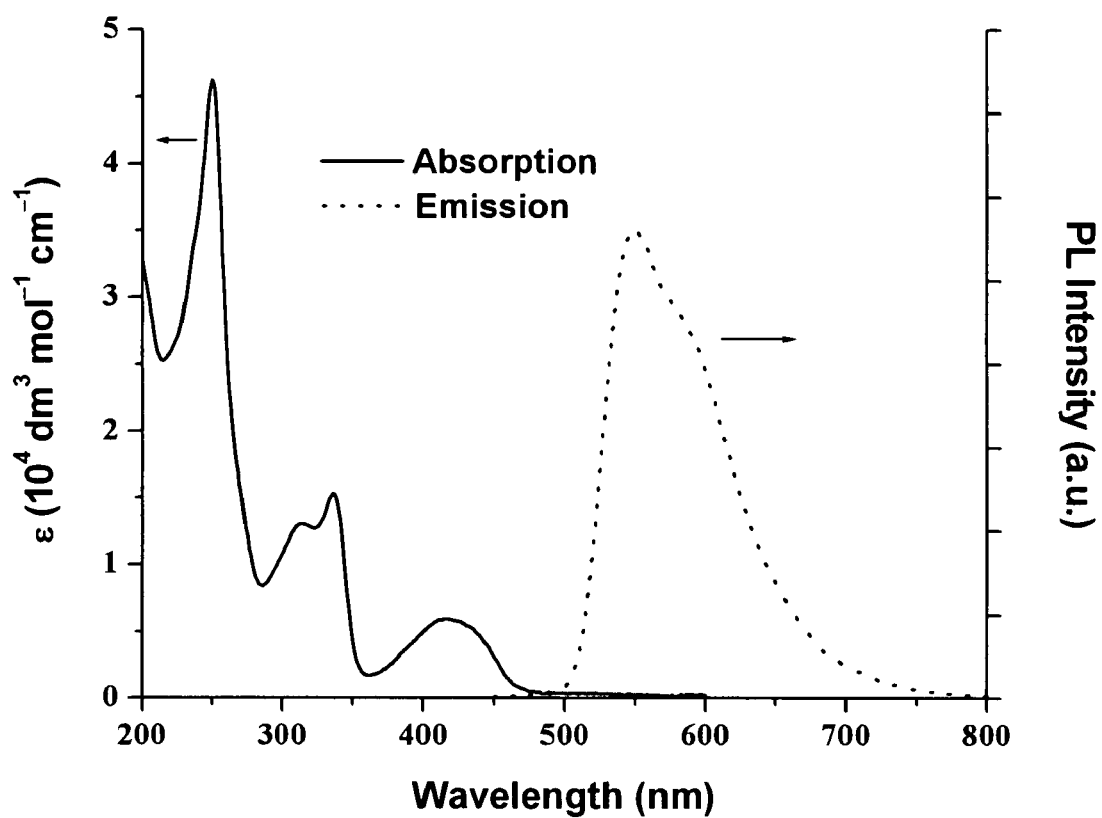
FIG. 2. Absorption and emission spectra of dopant complex 1 in $CH_3CN$ FIG. 3. Absorption and emission spectra of dopant complex 2 in $CH_3CN$
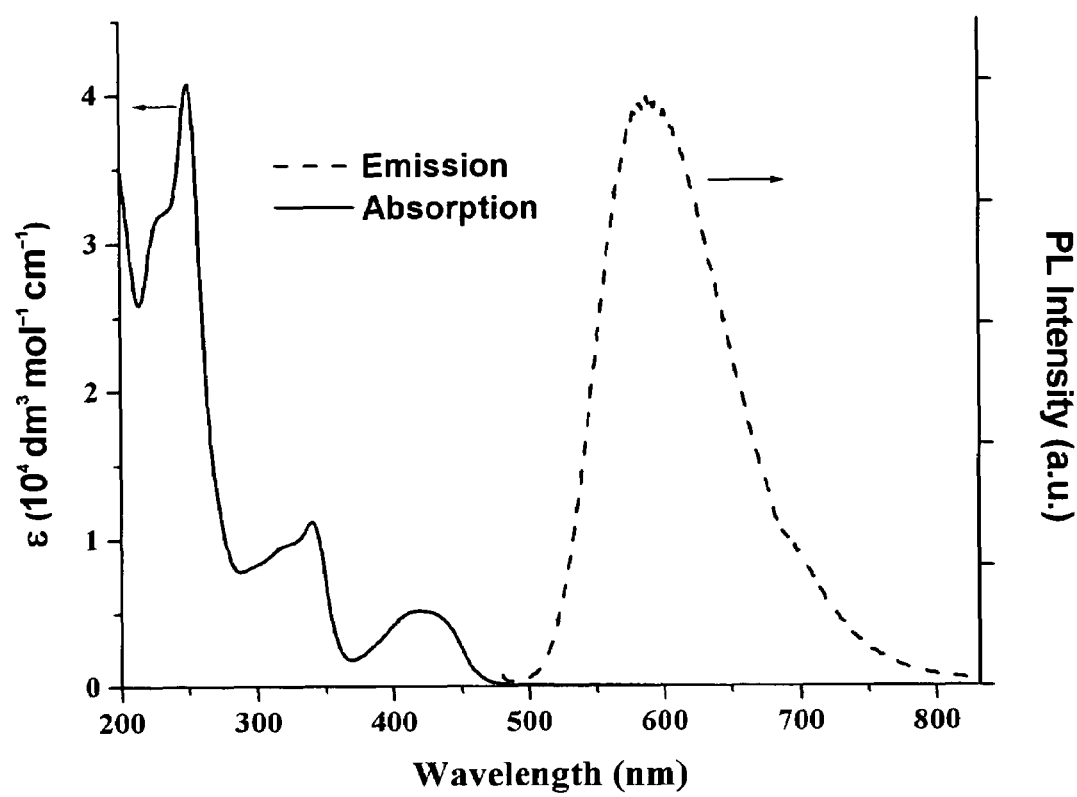

FIG. 4. Emission spectra of dopant complex 3 (in CH₃CN and as solid state)
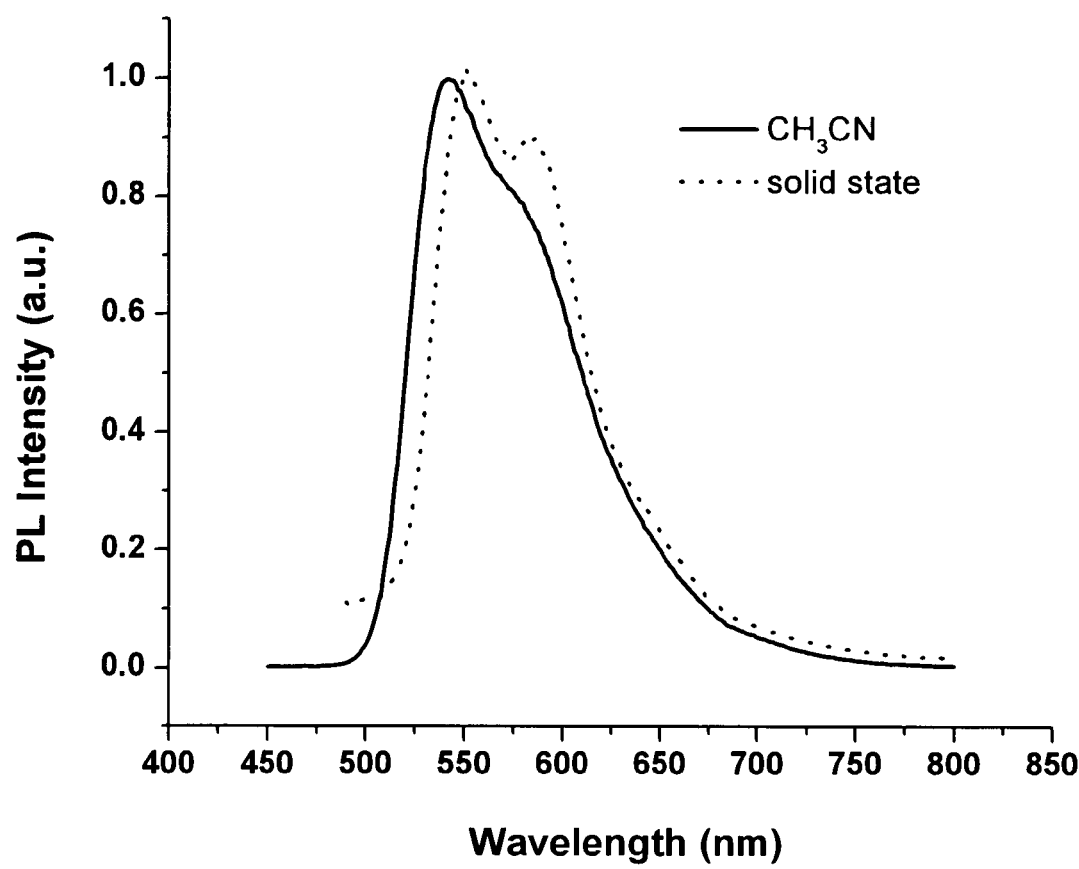

FIG. 5. Schematic diagram of OLED in present invention
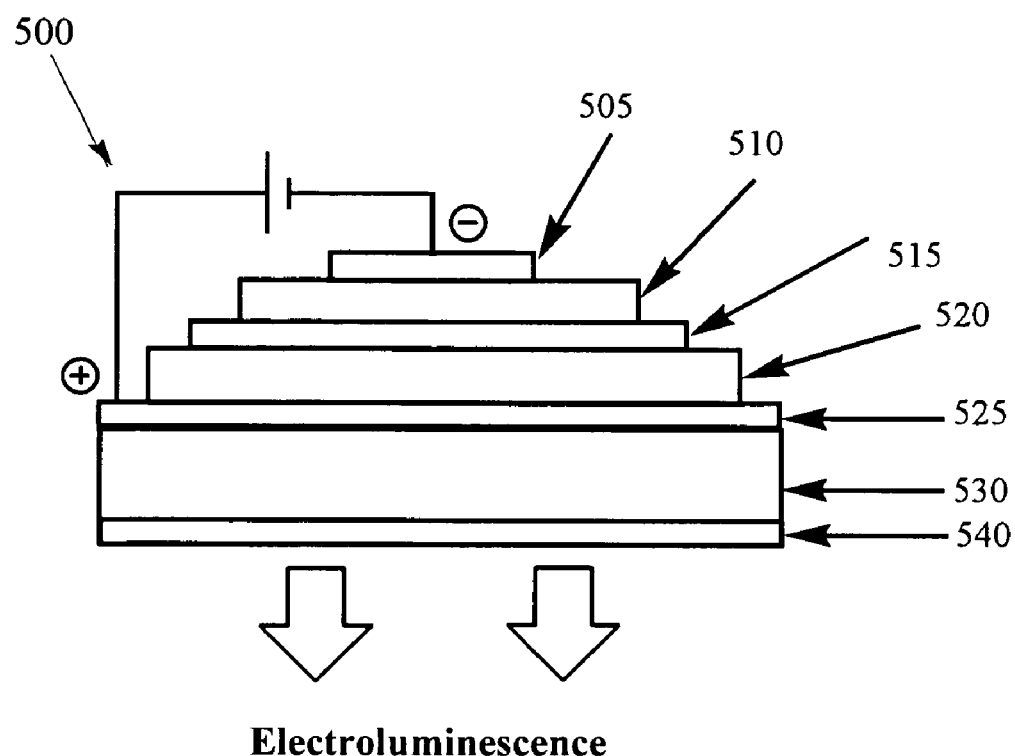
Electroluminescence FIG. 6. Electroluminescent spectrum and current density voltage-luminance curves of device A
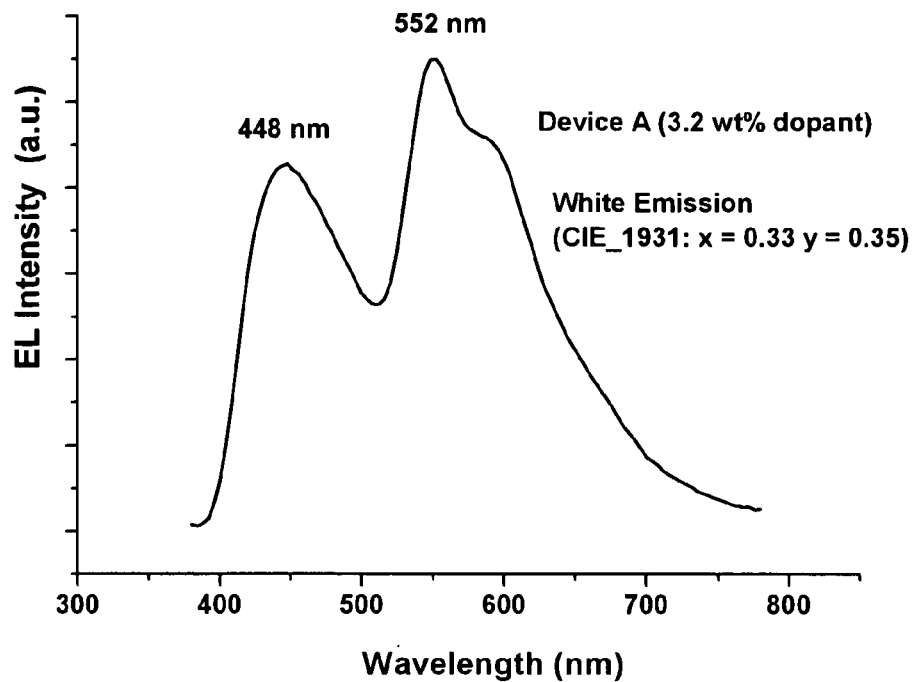
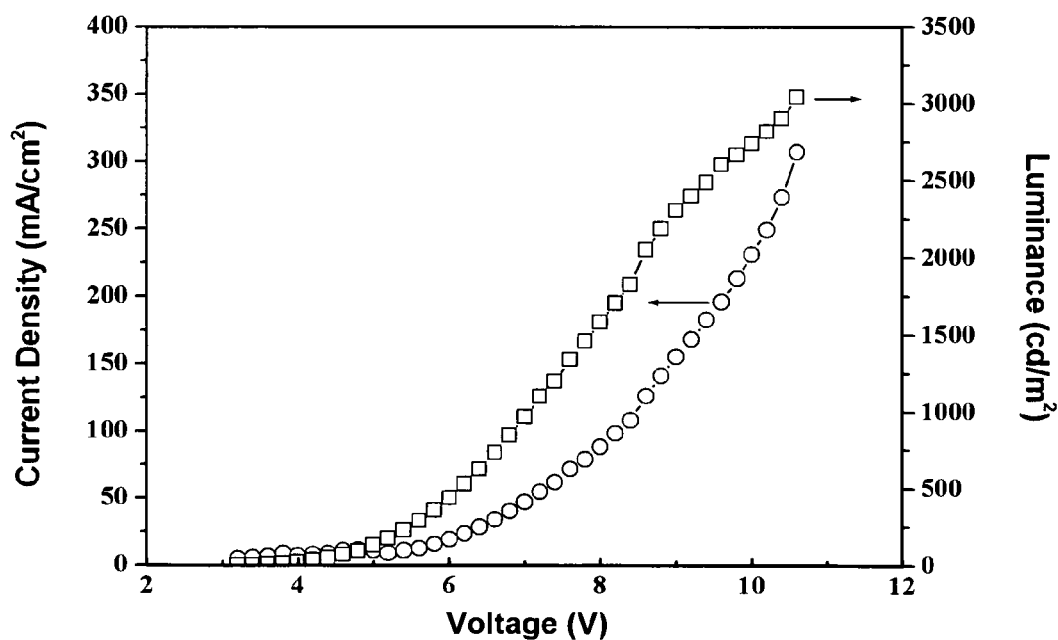

FIG. 7. Electroluminescent spectrum and current density-voltage-luminance curves of device D
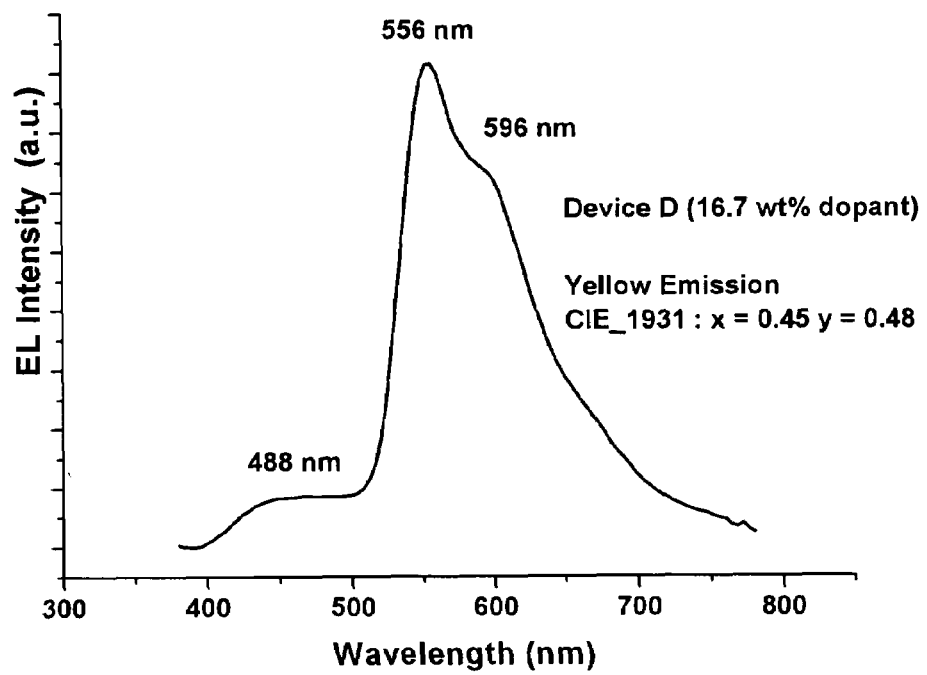
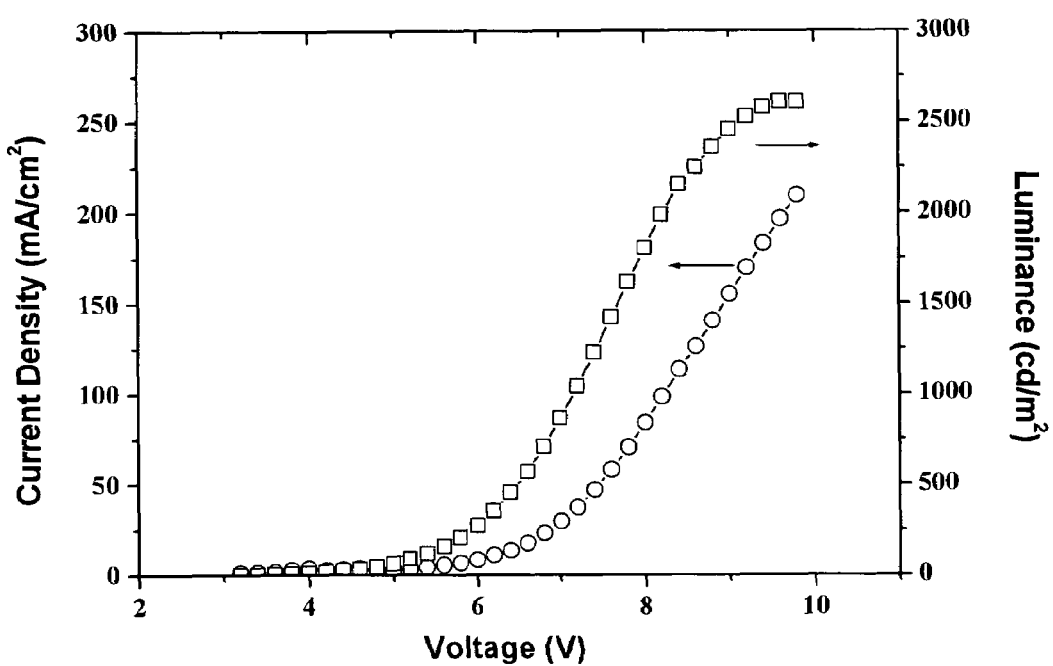

SYSTEM AND METHOD FOR PRODUCING LIGHT WITH ORGANIC LIGHT-EMITTING DEVICES

FIELD OF THE INVENTION

The present invention relates to efficient organic light-emitting devices which comprise a transition metal complex, the transition metal complex comprising a bidentate NO-type ligand, or tetradentate NOON-type ligand and a transition metal atom as the electrophosphorescent emitter. The invention also relates to methods for preparing thin film organic light-emitting devices and their use in applications such as flat-panel displays, liquid crystal displays and plasma panel displays.

BACKGROUND OF THE INVENTION

Organic light-emitting devices (OLEDs) are finding applications as next-generation flat-panel displays (FPDs), liquid crystal display (LCDs), and plasma display panels (PDPs). This has been driven by their favorable properties including lightweight, fast video response and low power consumption. To this end, organometallic compounds exhibiting electroluminescence are particularly attractive for electrophosphorescent applications, since both the ligand structure and the central metal atom can be varied to modify the properties of the device using these compounds.

Both fluorescent emission and phosphorescent emission are utilized in OLED technology based on electroluminescence. In an electroluminescent device, light emission from a fluorescent emitter occurs as a result of relaxation of singlet excitons in the emissive layer. U.S. Pat. No. 6,310,360 discloses that such emission is theoretically limited to internal quantum efficiencies of 25%. In contrast, phosphorescent emission occurs as the result of a forbidden formation of excitons, for example, when a triplet spin state relaxes or decays to a singlet spin state.

In recent years, the application of phosphorescent emitters in OLEDs has received considerable attention. Through the heavy atom effect of a transition metal, light emission results from radiative formation of triplet excitons due to the efficient intersystem crossing from singlet to triplet excited states. This results in internal quantum efficiencies of up to 100% (see Baldo et al., Nature 395:151(1998); Adachi et al., Appl. Phys. Lett., 77:904 (2000)).

Electrophosphorescent materials with different color emissions are known. Thompson et al. at the University of Southern California and Forrest et al. at Princeton University jointly reported a family of iridium complexes exhibiting improved brightness and efficiencies (see, e.g., U.S. Pat. No. 6,515,298 B2; U.S. Patent Application Publication No. 20020182441 A1; Lamansky et al., J. Am. Chem. Soc., 123:4304 (2001); and Xie et al., Adv. Mat., 13:1245 (2001)). Che and co-workers have demonstrated the use of metal organic complexes, such as platinum (II), copper (I), gold(I), and zinc(II) complexes, as OLED materials (see Y.-Y. Lin et al., Chem. Eur. J., 9:1263 (2003); Lu et al., Chem. Commun., 206 (2002); Ma et al., New J. Chem., 263 (1999); Ma et al., Appl. Phys. Lett., 74:1361 (1999); Ho et al., Chem. Commun., 2101 (1998); and Ma et al., Chem. Commun., 2491 (1998)). U.S. Pat. No. 6,048,630 discloses an electroluminescent device, based on phosphorescent Pt(OEP) ($H_2$OEP=octylethylporphyrin), which emits a saturated red color. In addition, international patent application No. WO 00/57676 discloses the use of electrophosphorescent dopants such as cis-bis[2-(2'-thienyl)pyridinato-N,$C^3$]platinum (II) (Pt(thpy)$_2$). Lamansky et al., Organic Electronics 2:53 (2001) disclose polymer-based OLEDs using platinum 2,8,12,17-tetraethyl-3,7,13,18-tetramethyl porphyrin (PtOX).

The use of organometallic compounds in OLEDs is also known. Adachi et al., Appl. Phys. Lett., 77:904 (2000) discloses an OLED generating red emissions with internal quantum efficiencies of 23% comprising 2,3,7,8,12,13,17,18-ocatethyl-21H,23H-porphine platinum(II) as the dopant. U.S. Pat. No. 6,048,630 discloses an OLED emitting a saturated red color comprising Pt(octylethylporphyrin) and a receiving compound.

In addition, cyclometallated complexes, where the metal is chelated to a nitrogen-heterocycle via both a N atom and a C atom are also reported to be useful in making OLEDs. U.S. Pat. No. 6,515,298 B2 discloses an electrophosphorescent device comprising an emissive layer comprising cyclometallated tris(2-phenylpyridine)metal compounds and an intersystem crossing molecule, where the metal is bonded to at least one carbon atom of the ligand.

U.S. Patent Application Publication No. 20020182441 A1 discloses OLEDs comprising cyclometallated iridium complexes in the emissive layer. The disclosed complexes have a metal atom bound to at least one mono-anionic, bidentate, carbon-coordination ligand and at least one non-mono-anionic, bidentate, nitrogen-coordination ligand. According to the reference, the resulting devices emit light in the blue, green, or red region of the visible spectrum, with the emission exhibiting a well-defined vibronic structure. Synthesis of such assymmetric complexes is necessarily more complex than the synthesis of symmetric organometallic complexes even though the organic ligands themselves may be assymmetric.

Lamansky et al. J. Am. Chem. Soc., 123:4304 (2001) discloses OLEDs with a cyclometallated iridium(acetylacetenato) complex in the emissive layer that provides an OLED exhibiting green, yellow and red electroluminescence, wherein the emission of the device can be changed by varying the structure of the nitrogen-heterocycle.

Besides being an alternative to a conventional illumination source, white organic light-emitting devices (WOLEDs) are expected to be useful in full color flat-panel display technology. J. Kido et al. suggested using WOLED arrays in which the white-light emission can be converted to red, green and blue (R-G-B) colors by color filters in a facile approach for the development of full color OLED display (see Kido et al., Science 267:1332, (1995)). By stacking emissive layers, white-light emission in OLEDs can be achieved. (See Andrade et al., Adv. Mater., 14:147 (2002); Huang et al., Appl. Phys. Lett., 80:2782 (2002); and Ko et al., Appl. Phys. Lett., 79:4234 (2001)).

WOLEDs have also been implemented with exciplexes being the emitting materials to take advantage of the broad spectrum produced by such materials. Exciplex based devices exhibit low quantum efficiencies, which typically do not exceed 0.6 lm/W. As consequence, typically, WOLEDs utilize multiple R-G-B dyes to provide the broad visible spectrum. (See international publication No. WO 02/091814 A2; U.S. Patent Application Publication No. 20020197511 A1; Kawamura et al., J. Appl. Phys., 92:87 (2002); Duggal et al., Appl. Phys. Lett., 80:3470 (2002); and Ko et al., Appl. Phys. Lett., 79:4234 (2001)). As may be expected, the use of multiple dyes in emission layers requires fine adjustment of the concentration of each dye.

Adamovich et al. in New. J. Chem., 26:1171 (2002) disclose WOLEDs containing the single dopant, platinum (II) [2-4,6-difluorophenyl]pyridinato-N,$C^{2'}$]β-diketonate in the emissive layer where an electron/exciton blocking layer is sandwiched between a hole transporting layer and the emissive layer. According to this reference, this sandwich structure improves the efficiency and color stability of the device. Moreover, Adamovich et al. reported that aggregation of such dopants results in generation of longer wavelength light. Thus, it is desirable for a broad spectrum emitting device to have a balanced distribution of unaggregated and aggregated dopants. Accordingly, Adamovich et al. describe alkyl derivatives of β-diketonates for use as single dopants that are less likely to aggregate and are more soluble due to the introduction of bulky alkyl groups.

SUMMARY OF THE INVENTION

The present invention is directed to OLEDs comprising an emissive layer that requires only a single electrophosphorescent emitter (but can contain more) and comprises at least one transition metal complex comprising two bidentate NO-type ligands or a tetradentate NOON-type ligand as the electrophosphorescent emitters. Embodiments with OLED devices of the invention exhibit improved stability of white light emission over time and better control over the variation in the composition of white light due to removal of the errors from imbalance of multiple dopants providing widely different color emissions. The OLED devices of the present invention also exhibit low turn-on voltages, high luminance, high quantum efficiencies, and may be modified by simply changing the dopant concentration to exhibit colors other than white light.

In preferred embodiments, the invention relates to OLEDs comprising an emissive layer having at least one transition metal complex that includes two bidentate NO-type ligands or a tetradentate NOON-type ligand as the electrophosphorescent emitter.

In one embodiment, the invention relates to a heterostructured organic light-emitting device comprising:

a substrate upon which a first electrode is placed;

a hole transport layer;

at least one emissive layer comprising at least one host material and at least one dopant complex, the dopant complex comprising a transition metal coordinated to two bidentate NO-type ligands or a tetradentate NOON-type ligand;

a charge transport layer; and a second electrode sandwiching the hole transport layer, emissive layer and charge transport layer between the first and the second electrode.

In a preferred embodiment, the invention relates to a heterostructured OLED comprising one or more dopant complexes of following formulae:

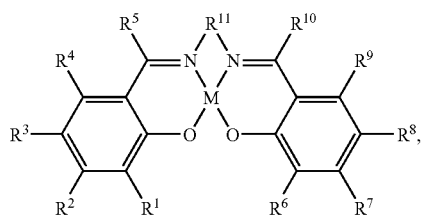

(I)

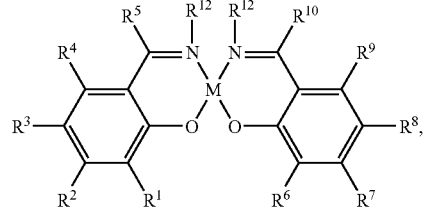

(II)

or mixtures thereof, wherein

M is a transition metal selected from the group consisting of Ni, Pd and Pt.;

each $R^1$—$R^{10}$ is independently —H, —OH, —NH$_2$, -halogen, —CN, —NO$_2$; —$R^{13}$, —OR$^{14}$, —NHR$^{14}$, or —N(R$^{14}$)$_2$;

where
$R^{11}$ is —(C(R$^{15}$)$_2$)$_x$—;
each $R^{12}$ is independently —H, —(C$_1$-C$_6$)alkyl, -phenyl, -naphthyl; -halogen, or —CN;
$R^{13}$ is -halogen; —(C$_1$-C$_6$)alkyl, -phenyl, or -naphthyl, each of which is unsubstituted or substituted with one or more —(C$_1$-C$_6$)alkyl, -phenyl, or -naphthyl;
$R^{14}$ is as defined above for $R^{13}$ less -halogen; and
$R^{15}$ is as defined above for $R^1$;
x is an integer number from 1 to 6.

In preferred embodiments of the invention, typically $R^5$=$R^{10}$, $R^4$=$R^9$, $R^3$=$R^8$, $R^2$=$R^7$, and $R^1$=$R^6$.

The present invention also relates to methods for making electroluminescent devices by depositing, e.g., by vapor deposition or spin coating, the dopant complexes in a thin layer having, for instance, a thickness of about 30 nm or less. In one embodiment, the vapor deposition comprises vapor deposition of at least one dopant complex, which complex dopes at least one host material.

In one embodiment, the present invention relates to a method of preparing a heterostructured white organic light-emitting diode, the method comprising the steps of:

providing a substrate upon which a first electrode is placed;

providing a hole transport layer on top of the first electrode;

forming an emissive layer on top of the hole transport layer, the emissive layer comprising at least one host material and at least one dopant complex, the dopant complex comprising a transition metal coordinated to two bidentate NO-type ligands or a tetradentate NOON-type ligand;

providing a charge transport layer on top of the emissive layer, and providing a second electrode on top of the charge transport layer.

In certain embodiments, the invention relates to illumination devices that are shaped to concentrate or scatter the emitted light, for instance, by suitably shaping the layer to be concave or convex and the like.

The present invention still further relates to the use of an OLED of the invention in flat panel display applications, as backlighting, or in combination with filters that may be controlled electronically to provide colored light at a specified position.

The present invention also relates to devices that provide different light intensity and color emission by using one or more emissive layers or using additives to modulate the ratio of monomers.

The present invention may be understood more fully by reference to the following detailed description and illustrative figures.

BRIEF DESCRIPTION OF THE DRAWINGS

FIG. 1 shows thermograms from the thermogravimetric analyses (TGA) of illustrative dopant complexes 1-3 of the present invention.

FIG. 2 shows the absorption and emission spectra of illustrative dopant complex 1 in a $CH_3CN$ solution.

FIG. 3 shows the absorption and emission spectra of illustrative dopant complex 2 in $CH_3CN$ solution.

FIG. 4 shows the emission spectra of illustrative dopant complex 3 in $CH_3CN$ solution and in solid state.

FIG. 5 shows the schematic diagram of an OLED of the present invention.

FIG. 6 shows the electroluminescent spectrum and current density-voltage-luminance curves of illustrative device A of the present invention.

FIG. 7 shows the electroluminescent spectrum and current density-voltage-luminance curves of illustrative device D of the present invention.

DETAILED DESCRIPTION OF THE INVENTION

Some definitions useful for describing the present invention are provided below:

As used herein, the phrase "bidentate NO-type ligands" refers to a molecule containing an imine group and a phenoxide group, which ligand is coordinated to a metal through the nitrogen and oxygen atoms of these groups.

As used herein, the phrase "tetradentate NOON-type ligand" refers to a molecule containing a two imine groups and two phenoxide groups, which ligand is coordinated to a metal through the nitrogen and oxygen atoms of these groups.

As used herein, the phrase "metal complex" means a complex formed between at least one metal and at least one ligand.

As used herein, the phrase "light-emitting device" refers to structures presenting an asymmetric impedance to current and comprising an emissive material, e.g., a dopant complex of the invention, that emits light when current is passed. Typically, such a device allows current to flow more easily in one direction when it is said to be forward biased. However, in some devices of the present invention significant current may flow in the reverse biased state as well with generation of light.

The present invention is directed to a heterostructured OLED comprising an emissive layer, wherein the emissive layer comprises a host material and at least one emissive material. Preferably, the emissive material is a dopant complex comprising a transition metal coordinated to two bidentate NO-type ligands or a tetradentate NOON-type ligand.

In one embodiment, the invention relates to a heterostructured organic light-emitting device comprising:

a substrate upon which a first electrode is placed;

a hole transport layer;

at least one emissive layer comprising at least one host material and at least one dopant complex, the dopant complex comprising a transition metal coordinated to two bidentate NO-type ligands or a tetradentate NOON-type ligand;

a charge transport layer; and a second electrode sandwiching the hole transport layer, emissive layer and charge transport layer between the first and the second electrode.

Preferably, the emissive material is a dopant complex comprising a transition metal complex comprising two bidentate NO-type ligands or a tetradentate NOON-type ligand and a transition metal atom. More preferably, the emissive material includes a dopant complex of the following formulae:

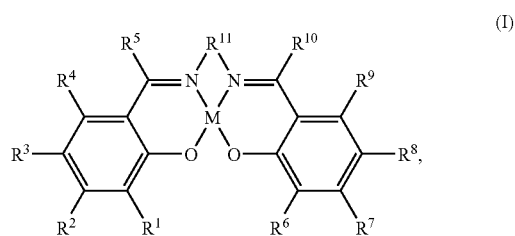

(I)

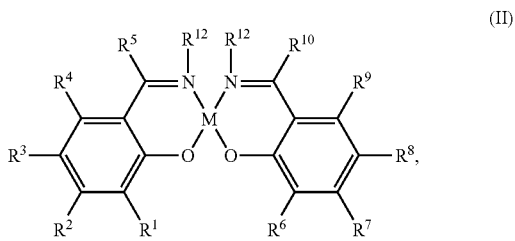

(II)

or mixtures thereof, wherein

M is a metal selected from the group consisting of Ni, Pd and Pt.;

each $R^1$—$R^{10}$ is independently —H, —OH, —$NH_2$, -halogen, —CN, —$NO_2$; —$R^{13}$, —$OR^{14}$, —$NHR^{14}$, or —$N(R^{14})_2$;

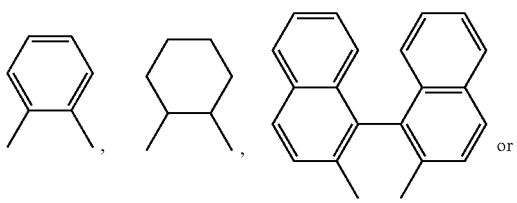

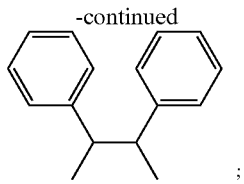

where $R^{11}$ is —$(C(R^{15})_2)_x$—;

each $R^{12}$ is independently —H, —$(C_1$-$C_6)$alkyl, -phenyl, -naphthyl; -halogen, or —CN;

$R^{13}$ is -halogen; —$(C_1$-$C_6)$alkyl, -phenyl, or -naphthyl, each of which is unsubstituted or substituted with one or more —$(C_1$-$C_6)$alkyl, -phenyl, or -naphthyl;

$R^{14}$ is as defined above for $R^{13}$ less -halogen; and $R^{15}$ is as defined above for $R^1$;

x is a integer number from 1 to 6.

In some embodiments, the compounds of formula (I) or (II) may comprise $R^1$—$R^{10}$ groups that are electron donors. Non-limiting examples of electron donor groups are amines including —$N(R^{14})_2$ and —$OR^{14}$.

In some embodiments, the compounds of formula (I) or (II) may comprise $R^1$—$R^{10}$ groups that are electron acceptors. Non-limiting examples of electron acceptor groups include —F, —Cl, —Br, —I; —$NO_2$, —$C(O)(C_1$-$C_6)$, —$C(O)O(C_1$-$C_6)$, —SCN, —$SO_3F$ and —CN.

Some additional metal complexes are described in Lin et al., *Eur. J. Chem.* 9:1203 (2003), which article is incorporated herein by reference in its entirety for all purposes.

Some illustrative example and exemplary compounds of formulas I and II are listed below in Table 1:

TABLE 1

Illustrative example and exemplary dopant complexes of formula (I).

| Structure | Dopant Complex |
|---|---|
|  | 1: n = 2<br>2: n = 3 |
|  | 3 |
|  | 4: Y = —$CH_3$<br>5: Y = —CN |
|  | 6: n = 2<br>7: n = 3 |
|  | 8: Z = —H<br>9: Z = —F<br>10: Z = —Cl<br>11: Z = —Br<br>12: Z = —I<br>13: Z = —$CH_3$<br>14: Z = -t-butyl<br>15: Z = —$NO_2$ |
|  | 16: Z = —H<br>17: Z = —F<br>18: Z = —Cl<br>19: Z = —Br<br>20: Z = —I<br>21: Z = —$CH_3$<br>22: Z = -t-butyl<br>23: Z = —$NO_2$ |
|  | 24: Z = —H<br>25: Z = —F<br>26: Z = —Cl<br>27: Z = —Br<br>28: Z = —I<br>29: Z = —$CH_3$<br>30: Z = -t-butyl<br>31: Z = —$NO_2$ |

Preferably, the emissive material is a dopant complex that produces electroluminescent emission at ambient temperature. In a preferred embodiment, an OLED of the present comprises substantially a single emissive material in the emissive layer that produces electroluminescent emission at ambient temperature. Advantageously, OLEDs of the present invention exhibit reduced degradation of white emission over time due to the use of similar dopant complexes or a single dopant complex in an emissive layer such that a dopant complex comprises at least one transition metal complex comprising two bidentate NO-type ligands or a tetradentate NOON-type ligand.

Non-limiting examples of bidentate NO-type ligands include those shown above for dopant complexes 4 and 5. For example, NO-type ligands can be selected from unsubstituted 6-membered or 5-membered ring or substituted 6-membered or 5-membered ring; wherein the substituted 6-membered or 5-membered ring includes at least one substituent selected from the groups: a hydrogen, a halogen, a hydroxyl group, an alkyl group, a cycloalkyl group, an aryl group, an acyl group, an alkoxy, an acyloxy group, an amino group, an acylamino group, an aralkyl group, a cyano group, a carboxyl group, a thio group, a vinyl group, a styryl group, an aminocarbonyl group, a carbonyl group, an aranyl, an aryloxycarbonyl group, a xylyloxycarbonyl group, a phenoxycarbonyl group or an alkoxycarbonyl group as well as recognized donor or acceptor groups; wherein the substituents, for example, an aryl group, may combine together to form a substituted or unsubstituted, saturated or unsaturated ring with any number of members.

Non-limiting examples NOON-type ligands include those shown above for dopant complexes 1-3 and 6-31. For example, NOON-type ligands can be selected from unsubstituted 6-membered or 5-membered ring or substituted 6-membered or 5-membered ring; wherein those substituted 6-membered or 5-membered ring includes at least one substituent selected from the groups: a hydrogen, a halogen, a hydroxyl group, an alkyl group, a cycloalkyl group, an aryl group, an acyl group, an alkoxy, an acyloxy group, an amino group, an acylamino group, an aralkyl group, a cyano group, a carboxyl group, a thio group, a vinyl group, a styryl group, an aminocarbonyl group, a carbonyl group, an aranyl group, an aryloxycarbonyl group, a xylyloxycarbonyl group, a phenoxycarbonyl group or an alkoxycarbonyl group as well as recognized donor or acceptor groups; wherein the substituents, for example, an aryl group, may combine together to form a substituted or unsubstituted, saturated or unsaturated ring with any number of members. In a preferred embodiment, the transition metal is Pt.

In a preferred embodiment, the dopant complex is selected from the group consisting of dopant complex 1, 2, 3 and mixtures thereof More preferably, the dopant complex is dopant complex 1.

The emissive layer of the present invention also comprises a suitable host material into which the dopant complex is added or "doped." Non-limiting examples of host materials useful in the present invention include beryllium bis(2-(2'-hydroxyphenyl)pyridine (Bepp$_2$); 3-phenyl-4-(1'-naphthyl)-5-phenyl-1,2,4-triazole (TAZ); 2,9-dimethyl-4,7-diphenyl-1,10-phenanthroline (BCP); 4,4'-N,N'-dicarbazole-biphenyl (CBP); 1,3-bis(N,N-t-butyl-phenyl)-1,3,4-oxadiazole (OXD7); N,N'-diphenyl-N,N'-bis(2-naphthalene)benzidine (β-NPB); N,N'-bis(3-methylphenyl)-N,N'-bis(phenyl)benzidine (TPD); 1,3,5-tris(3-methyldiphenylamino)benzene (m-MTDAB); and tetrakis(diarylamino)-9,9'-spirobifluorenes.

In this invention, one or more suitable host materials are employed in an emissive layer together with one or more dopants such that the host material can transfer energy from host to dopant within the emissive layer. Preferably, the host material should be thermally and morphologically stable, as a hole blocker, to trap hole or electron carriers from injection into the emissive layer, thus beneficially enhancing charge injection at the interfaces, and charge mobility.

The concentration of dopant complex is typically less than about 20% by weight, based on the weight of dopant complex and host material. In some embodiments, the concentration of dopant complex may be less than about 10% by weight, or even less than about 5% by weight, based on the weight of dopant complex and host material. In one embodiment, white light is produced when the concentration of dopant is about 3-4 wt. %, preferably about 3.2% by weight, based on the weight of dopant complex and host material.

An OLED of the present invention typically includes an anode; a hole transport layer; an emissive layer comprising a host material and at least one dopant complex; a transport layer; and a cathode. In one embodiment, the concentration of dopant complex in the emissive layer of the OLED may be less than about 5 wt. % based on the weight of dopant complex and host material.

In one embodiment, the OLED of the invention exhibits an intense white emission at CIE__1931 coordinates of x=0.33 and y=0.35, which is quite close to the standard white light source of CIE__1931 coordinates at x=0.33 and y=0.33. In general, the OLED device of the present invention exhibits a broad visible spectrum that may be suitable for use as a white emission or be easily modified to make it into a desired white emission by filtering out excess color or adding a small amount of a color. In one embodiment, the desired white emission is obtained by manipulating the concentration and proportion of two or more dopant complexes in the OLED. Such manipulation of two dopant complexes are easier than managing the precise proportions of three dopants to produce white light. Similarly, an OLED comprising a combination of broad band dopants will be less sensitive to variations in the amount of each dopant than is an OLED comprising a combinations of dopants that each emit a narrower spectrum of light.

Non-limiting examples of an anode useful for an OLED of the present invention are indium-tin-oxide (ITO), poly(3,4-ethylenedioxythiophene): poly(styrene sulfonate) (PEDOT:PSS) and doped polyaniline. Non-limiting examples of a host material useful for an OLED of the present invention include those listed above.

Non-limiting examples of dopant complexes comprising a transition metal coordinated to two bidentate NO-type ligands or a tetradentate NOON-type ligand include those shown for dopant complexes 1-33 in Table 1 above.

Non-limiting examples of hole transport layer materials, for the function of hole-injection and transport, useful for the OLED is beryllium bis(2-(2'-hydroxyphenyl)pyridine (Bepp$_2$); 3-phenyl-4-(1'-naphthyl)-5-phenyl-1,2,4-triazole (TAZ); 2,9-dimethyl-4,7-diphenyl-1,10-phenanthroline (BCP); 4,4'-N,N'dicarbazole-biphenyl (CBP); 1,3-bis(N,N-t-butyl-phenyl)-1,3,4-oxadiazole (OXD7); N,N'-diphenyl-N,N'-bis(2-naphthalene)benzidine (β-NPB); N,N'-bis(3-methylphenyl)-N,N'-bis(phenyl)benzidine (TPD); 1,3,5-tris(3-methyldiphenylamino)benzene (m-MTDAB); and tetrakis(diarylamino)-9,9'-spirobifluorenes.

Using an arylamine moiety as hole-transporting material generally enhances the function of hole-injection and transport and improve both EL efficiency and stability of the OLED. In general, hole-transporting materials are categorized into biphenyl diamine, starburst amine or spiro-linked diamine molecules.

Non-limiting examples of materials suitable for a charge transport layer include lithium fluoride, cesium fluoride and lithium benzoate.

By inserting an ultra-thin (i.e., less than about 1.5 nm)charge transport layer, device performance can be enhanced dramatically. In general, majority of carriers are holes since the mobility of hole is greater than electron. Thus, lowering the charge barrier of electron injection is especially effective for balance of hole and electron currents to result in an effective OLED.

The use of a low work function metal as cathode is desirable for fabricating an effective electroluminescence device by performing the function of an electron-injection interface rather well. Alkali or alkaline earth metals are usually employed for use as cathode in such a device.

Non-limiting examples of materials suitable as cathodes include aluminum, potassium, lithium, magnesium, silver, gold, rubidium, beryllium and cesium.

In another embodiment, the OLED comprises an emissive layer, the emissive layer comprising at least one dopant complex comprising a transition metal coordinated to two bidentate NO-type ligands or a tetradentate NOON-type ligand, wherein the device exhibits a white emission having a CIE_1931 coordinates at x=0.33 and y=0.35. Preferably, the metal complex comprising two bidentate NO-type ligands or a tetradentate NOON-type ligand is a compound of formula (I) or (II).

Compounds of formula (I) or (II) can be prepared by modification of known procedures. The precursor ligands to compounds of formula (I) and (II), i.e., $N_2(OH)_2$ and N(O)H are commercially available from, e.g., Aldrich Chemical, Milwaukee, Wis. As an example, one equivalent of a metal salt, e.g., $K_2PtCl_4$, is added to an alkali solution (~1N) containing two equivalents of the N(O)H ligand to provide the compounds of formula (II). (See, e.g., Ivanoa et al., *Russ. J. Phys. Chem.*, 65:1536(1991); and Ardasheva et al., *Russ. J. Inorg. Chem.*, 43:85 (1998)).

The present invention is also directed to methods for preparing an OLED by, for instance, supplementing known methods for preparing OLEDs with the deposition of dopant complexes containing a transition metal coordinated to ligand(s) such as two bidentate NO-type ligands, or a tetradentate NOON-type ligand. Compounds (I) and (II) provide the surprising result of helping make efficient OLED, it is believed without being bound by theory, by reducing triplet-triplet annihilation. In combination with a suitable host, as taught by this application, they allow making of an effective WOLED.

In a typical procedure, the ITO (anode) layer is coated onto a glass slide using conventional coating methods to provide coated glass with a resistance of 20 Ω/square cm. The coated slide is then cleaned with aqueous detergent, deionized water, acetone, isopropanol, methanol and deionized water, followed by ultra-violet-ozone cleaner. The hole transport, emissive and charge transport layers are then deposited in sequence at a rate of 2 or 5 Å/sec. under $5\times10^{-6}$ Torr without breaking vacuum between different deposition processes. The thicknesses of the hole transport, emissive and charge transport layers are about 500, 500 and 15 Å, respectively. The concentration of dopant complex in the emissive layer can be varied by changing the time or other parameters.

The aluminum-containing layer (cathode layer) is deposited in a separate chamber under about $5\times10^{-6}$ Torr immediately after organic deposition. The typical thickness of the cathode layer is about 2500 Å. The devices are fabricated in a standard thermal evaporation method. The base pressure is maintained in the $5\times10^{-6}$ Torr range. The host and dopant complex are both deposited by the thermal evaporation. During the thermal evaporation, two crucibles containing host and dopant complex are heated under fixed currents. The deposition rate of the host and dopant layers are monitored by two crystal oscillators, respectively. Thus, the concentration of dopant complex in host can be varied by controlling the deposition rates of host and dopant complex. For instance, the deposition rates of host and dopant complex are about 9 and about 1 Å/sec in an example embodiment. Hence, the concentration of dopant in a emissive layer is about 10%.

The present invention also relates to methods for using an OLED in or in combination with illumination devices, backlight sources, flat-panel displays, liquid crystal displays, plasma panel displays, toys and the like.

An advantage of the OLEDs of the present invention is that the color of the emitted light may be tuned during fabrication by changing the concentration of the dopant complex. In one embodiment, the present invention also relates to methods for adjusting or tuning the intensity or color emission of the OLED. Preferably, the dopant complex is dopant complex 1-33 or a mixture thereof More preferably, the dopant complex is dopant complex 1-3 or a mixture thereof Most preferably, the dopant complex is dopant complex 1.

For instance, an OLED comprising dopant complex 1 provides a yellow emission when the concentration of the dopant complex in the emissive layer ranges from 7.7 to 16.7 wt % based on the weight of the dopant complex and the host material.

In other embodiments, the color and/or intensity of the emission of the OLEDs of the present invention may be changed by the use of filters, as is known in the art. In one embodiment, the invention relates to a heterostructured organic light-emitting device further comprising at least one filter layer.

The following examples are set forth to aid in understanding of the inventions but are not intended to, and should not be interpreted to limit in any way the claimed invention.

EXAMPLES

Example 1

Example 1 shows the physical properties of non-limiting illustrative emissive materials corresponding to dopant complexes 1-3 of the present invention.

The absorption and photoluminescence properties of dopant complexes 1-3 are provided in Table 2. Dopant complexes 1-3 exhibit similar absorption features and a low-energy band is observed at $\lambda_{max}$ 417 to 432 nm. The photoluminescence (PL) spectrum is substantially independent of excitation wavelength from 300 to 450 nm. At room temperature, strong yellow PL is obtained with quantum yields (Φ) up to 0.19 in $CH_3CN$. The emission lifetimes of the dopant complexes range from 0.46 to 3.5 μs.

TABLE 2

Physical characterization of dopant complexes 1-3.

| Dopant complex | $\lambda_{abs}$ (nm) [ε, $10^4$ dm$^3$ mol$^{-1}$ cm$^{-1}$] | $\lambda_{em,\ sol.}$ (nm)[a] | $\Phi_{em,\ sol.}$ [τ, (μs)][b] | $\lambda_{em}$ solid state (nm)[c] | $T_d$ (° C.)[d] |
|---|---|---|---|---|---|
| 1 | 250 [4.62], 314 [1.30], 336 [1.53], 417 [0.59] | 550, 580[e] | 0.19 [3.5] | 548[e], 594, 648[e] | 406 |
| 2 | 250 [4.08], 320 [0.96], 340 [1.12], 420 [0.52] | 592 | 0.087 [0.46] | 598 | 369 |

TABLE 2-continued

Physical characterization of dopant complexes 1-3.

| Dopant complex | $\lambda_{abs}$ (nm) [$\epsilon$, $10^4$ dm$^3$ mol$^{-1}$ cm$^{-1}$] | $\lambda_{em, sol.}$ (nm)[a] | $\Phi_{em, sol.}$ [$\tau$, ($\mu$s)][b] | $\lambda_{em\ solid\ state}$ (nm)[c] | $T_d$ (° C.)[d] |
|---|---|---|---|---|---|
| 3 | 249 [4.60], 316 [1.16], 339 [1.42], 413 [0.53], 432[e] [0.48] | 541, 580[e] | 0.18 [3.4] | 551, 585 | 382 |

[a]PL emission was measured in acetonitrile (CH$_3$CN)
[b]Lifetime was measured at peak maximum
[c]PL emission was measured as solid state at 298° K
[d]Decomposition temperature determined by TGA with heating rate of 15° C./min
[e]Peak appears as shoulder The thermal behavior of the dopant complexes was measured by thermogravimetric analyses (TGA) at a heating rate of 10° C./min. TGA measures weight changes in a material as a function of temperature (or time) under a controlled atmosphere. Its principal uses include measurement of a material's thermal stability and composition. The thermograms (FIG. 1) show that all the dopant complexes exhibit high thermal stabilities. For example, dopant complex 1 is stable up to 406° C. under a nitrogen atmosphere. Accordingly, those dopant complexes should be suitable for sublimation and be stable enough for vacuum deposition.

FIG. 2 shows representative UV-visible spectra (absorption and emission) of dopant complex 1 in CH$_3$CN solution. The solution exhibits a strong absorption band at 250 nm ($\epsilon$=46200 dm$^3$mol$^{-1}$ cm$^{-1}$) and a moderately intense absorption band at 336 nm ($\epsilon$=15300 dm$^3$mol$^{-1}$ cm$^{-1}$). In addition, a broad absorption band can be found at ca. 417 nm ($\epsilon$=5900 dm$^3$mol$^{-1}$ cm$^{-1}$). Upon excitation at 417 nm, intense yellow PL emission in CH$_3$CN is obtained at $\lambda_{max}$ 550 nm and a shoulder around 580 nm.

FIG. 3 shows UV-vis absorption and emission spectra of dopant complex 2 in CH$_3$CN solution. The solution exhibits several vibronic absorption transitions from 250 to 340 nm ($\epsilon$=40800 to 11200 dm$^3$mol$^{-1}$ cm$^{-1}$) and a broad band at 420 nm ($\epsilon$=5100 dm$^3$mol$^{-1}$ cm$^{-1}$). The PL emission exhibits a featureless emission band at $\lambda_{max}$ 592 nm.

FIG. 4 shows the PL emission spectra of dopant complex 3 in CH$_3$CN and in the solid state with the solid state emission maximum red-shifted by ca. 300 cm$^{-1}$ compared to the emission in CH$_3$CN. These results indicate that the wavelength of emission can be shifted by alternating the thickness of the thin-film, and this effect can be used to fine-tune EL color emission.

Example 2

Example 2 illustrates a non-limiting method for preparing OLED A of the present invention. ITO glass with sheet resistance of about 20 Ω/square cm was cleaned three times in sequence with detergent solution, deionized water, acetone, isopropanol, methanol and deionized water, followed by ultra-violet-ozone cleaner. The devices were then fabricated using a standard thermal evaporation method by laminating each layer in sequence at a deposition rate of about 2 Å/sec or about 5 Å/sec using a base pressure of about 5×10$^{-6}$ Torr and without breaking vacuum between different vacuum deposition sequences. The emissive layer was prepared by fixed-current heating of crucibles containing the host and dopant complex to provide deposition rates of 9 Å/sec and 1 Å/sec for the host and dopant complex, respectively. Two crystal oscillators were used to monitor the deposition rates. The fixed-current heating provided an emissive layer containing about 3.2 wt. % dopant complex.

The structure of device A is schematically shown in FIG. 5. Device A (500) has multiple layers as shown. In particular, shown is cathode 505, preferably comprising aluminum, on top of charge transport layer 510 which comprises LiF. LiF layer 510 is in contact with emissive layer 515, which comprises Bepp$_2$/dopant, which is, in turn, in contact with hole transport layer 520 comprising NPB. Hole transport layer 520 is deposited upon anode 525, comprising indium-tin-oxide, which, in turn, is deposited upon a glass substrate 530. Preferably, the thickness for NPB is 500 Å (hole transport layer 520), and emissive layer 515 is about 500 Å thick. Charge transport layer 510 is 15 Å thick and cathode layer 505 is preferably about 2500 Å thick. The emissive area of device 500 is 3×3 mm$^2$, which is defined the area of cathode and anode which overlap.

Although not shown, glass substrate 530 need not be flat in all embodiments of the invention. In one embodiment, the glass substrate 530 is shaped, for instance, in a concave shape to focus the light generated in emissive layer 515, which provides even greater light intensity in a small region. In another embodiment, the glass substrate 530 is shaped, for instance, in a convex shape that spreads the generated light more diffusely. Optionally, device A can include a filter 540.

Table 3 below shows the concentration of dopant complex 1 in various embodiments of the invention. Devices B-D correspond to device A except for dopant concentration.

TABLE 3

Electroluminescent properties of devices A-D with dopant complex 1.

| Device | Dopant complex 1[a] (wt. %) | Turn-on voltage (V) | EL Emission | CIE_1931 (x, y) | Maximum Efficiency (cd/A) | Maximum Luminance (cd/m$^2$) |
|---|---|---|---|---|---|---|
| A | 3.2 | 4.8 | White | 0.33, 0.35 | 1.53 | 3040 |
| B | 7.7 | 4.0 | Yellow | 0.37, 0.41 | 2.53 | 3250 |
| C | 11.1 | 4.0 | Yellow | 0.43, 0.47 | 2.77 | 2810 |
| D | 16.7 | 4.8 | Yellow | 0.45, 0.48 | 2.07 | 2610 |

[a]The concentration of metal compound (dopant) is based on the weight of dopant complex 1 and host material.

The EL spectrum and the current density-voltage-luminance characteristics curves of device A are shown in FIG. 6. At an applied voltage of 10 V, emission peaks at 448 and 552 nm were observed. The turn-on voltage was approximately 4.8 V. The maximum efficiency observed for the device was 0.85 lm/W (1.53 cd/A), with luminance of 290 cd/m$^2$ at applied voltage of 5.6 V. A maximum luminance of 3040 cd/m² was obtained at driving voltage of 10.6 V. The EL color of device A is white (CIE_1931 coordinates: x=0.33, y=0.35).

The EL spectrum and current density-voltage-luminance characteristics curves of device D are shown in FIG. 7. This device exhibits an intense EL peak at 556 nm with shoulders at 488 and 596 nm. The turn-on voltage of device D was approximately 5 V. The maximum efficiency was 1.13 lm/W (2.07 cd/A), with luminance of 210 cd/m² at applied voltage of 5.8 V. The maximum luminance of 2610 cd/m² was obtained at 9.8 V. The EL color of device D is yellow (CIE_1931 coordinates: x=0.45, y=0.48).

The foregoing description of the preferred embodiments of the present invention has been presented for purposes of illustration and explanation. The various cited references and documents in the preceding description are all incorporated herein by reference in their entirety for all purposes. The description is not intended to be exhaustive nor to limit the invention to the precise form disclosed. As is expected, many modifications and variations will be apparent to those skilled in the art since the embodiments were chosen and described in order to explain the principles of the invention and its practical applications, thereby enabling others skilled in the art to understand the invention. Various contemplated alternative embodiments and modifications that are suited to a particular use are within the scope of the invention. It is intended that the scope of the invention be defined by the accompanying claims and their equivalents.

What is claimed is:

1. A heterostructured organic light-emitting device comprising at least one emissive layer comprising at least one host material and at least one dopant complex, the dopant complex comprising a transition metal coordinated to two bidentate NO-type ligands or a tetradentate NOON-type ligand, and the dopant complex is of the formula

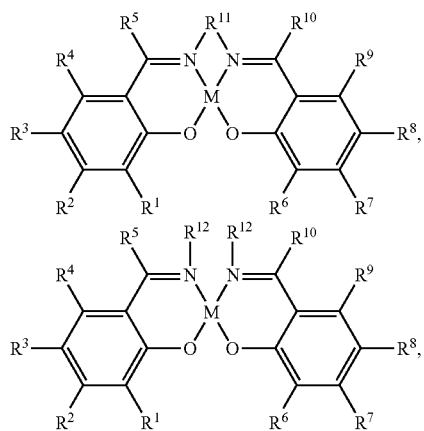

or mixtures thereof, wherein

M is selected from the group consisting of Ni, Pd and Pt;
each $R^1$-$R^{10}$ is independently —H, —OH, —NH$_2$, -halogen, —CN, —NO$_2$; —$R^{13}$, —O$R^{14}$, —NH$R^{14}$, or —N($R^{14}$)$_2$;
$R^{11}$ is —(C($R^{15}$)$_2$)$_x$—,

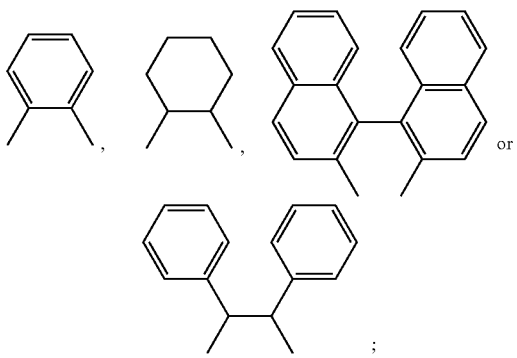

where
each $R^{12}$ is independently selected from the group consisting of —H, —(C$_1$-C$_6$)alkyl, -phenyl, -naphthyl; -halogen, and —CN;
$R^{13}$ is -halogen; —(C$_1$-C$_6$)alkyl, -phenyl, or -naphthyl, each of which is unsubstituted or substituted with one or more —(C$_1$-C$_6$)alkyl, -phenyl, or -naphthyl;
$R^{14}$ is as defined above for $R^{13}$ less halogen; and
$R^{15}$ is as defined above for $R^1$;
x is an integer number from 1 to 6.

2. A heterostructured organic light-emitting device according to claim 1 comprising:
a substrate having a first electrode on a surface thereof;
a hole transport layer;
at least one emissive layer comprising at least one host material and at least one dopant complex, the dopant complex comprising a transition metal coordinated to two bidentate NO-type ligands or a tetradentate NOON-type ligand;
a charge transport layer; and
a second electrode sandwiching the hole transport layer, emissive layer and charge transport layer between the first and the second electrode.

3. The heterostructured organic light-emitting device of claim 2, wherein the emissive layer contains a single dopant complex, which complex dopes the host material.

4. The heterostructured organic light-emitting device of claim 3, wherein the single dopant complex is present as a monomer, a dimer, an oligomer, or mixtures thereof.

5. The heterostructured organic light-emitting device of claim 2, wherein the host material is at least one member selected from the group consisting of beryllium bis(2-(2'-hydroxyphenyl)pyridine (Bepp$_2$); 3-phenyl-4-(1'-naphthyl)-5-phenyl-1,2,4-triazole (TAZ); 2,9-dimethyl-4,7-diphenyl-1,10-phenanthroline (BCP); 4,4'-N,N'-dicarbazole-biphenyl (CBP); 1,3-bis(N,N-t-butyl-phenyl)-1,3,4-oxadiazole (OXD7); N,N'-diphenyl-N,N'-bis(2-naphthalene)benzidine (β-NPB); N,N'-bis(3-methylphenyl)-N,N'-bis(phenyl)benzidine (TPD); 1,3,5-tris(3-methyldiphenylamino)benzene (m-MTDAB); and tetrakis(diarylamino)-9,9'-spirobifluorenes.

6. The heterostructured organic light-emitting device of claim 2 further comprising a plurality of emissive layers.

7. The heterostructured organic light-emitting device of claim 2 further comprising at least one filter layer.

8. The heterostructured organic light-emitting device of claim 2, wherein the emissive layer is vapor deposited or spin-coated.

9. The heterostructured organic light-emitting device of claim 8, wherein the vapor deposition comprises vapor deposition of at least one dopant complex, which complex dopes at least one host material.

10. The heterostructured organic light-emitting device of claim 2, wherein the hole transport layer comprises at least one material selected from the group consisting of beryllium bis(2-(2'-hydroxyphenyl)pyridine (Bepp$_2$); 3-phenyl-4-(1'-naphthyl)-5-phenyl-1,2,4-triazole (TAZ); 2,9-dimethyl-4,7-diphenyl-1,10-phenanthroline (BCP); 4,4'-N,N'-dicarbazole-biphenyl (CBP); 1,3-bis(N,N-t-butyl-phenyl)-1,3,4-oxadiazole (OXD7); N,N'-diphenyl-N,N'-bis(2-naphthalene)benzidine (β-NPB); N,N'-bis(3-methylphenyl)-N,N'-bis(phenyl)benzidine (TPD); 1,3,5-tris(3-methyldiphenylamino)benzene (m-MTDAB); and tetrakis (diarylamino)-9,9'-spirobifluorenes.

11. The heterostructured organic light-emitting device of claim 2, wherein the charge transport layer comprises lithium fluoride, cesium fluoride or lithium benzoate.

12. The heterostructured organic light-emitting device of claim 1, wherein M is Pt, $R^5=R^{10}$, $R^4=R^9$, $R^3=R^8$, $R^2=R^7$, and $R^1=R^6$.

13. The heterostructured organic light-emitting device of claim 12, wherein the dopant complex is selected from the group consisting of:

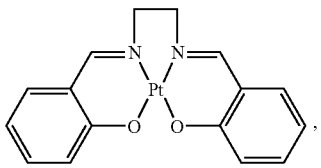

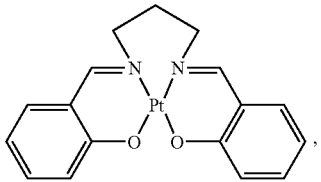

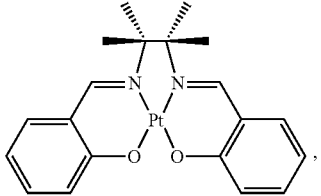

and mixtures thereof.

14. The heterostructured organic light-emitting device of claim 1, wherein CIE_1931 coordinates describing light emission are substantially x=0.33 and y=0.35.

15. A method for preparing a heterostructured white organic light emitting diode, the method comprising forming an emissive layer comprising at least one host material and at least one dopant complex, the dopant complex comprising a transition metal coordinated to two bidentate NO-type ligands or a tetradentate NOON-type ligand, wherein said dopant complex is of the formula

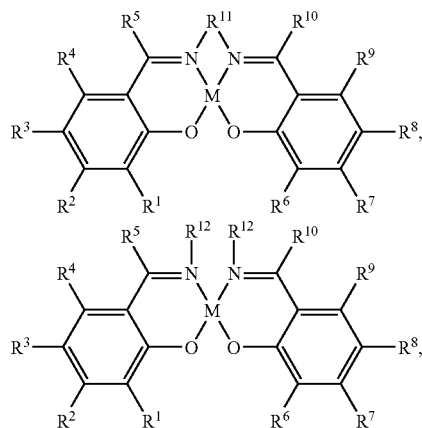

or mixtures thereof, wherein
M is selected from the group consisting of Ni, Pd and Pt;
each $R^1$-$R^{10}$ is independently —H, —OH, —NH$_2$, -halogen, —CN, —NO$_2$; —$R^{13}$, —OR$^{14}$, —NHR$^{14}$, or —N(R$^{14}$)$_2$;
$R^{11}$ is —(C(R$^{15}$)$_2$)$_x$—,

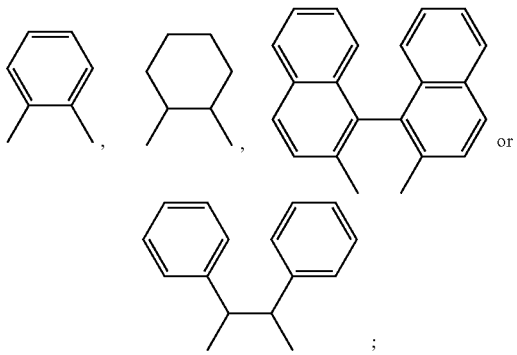

where
each $R^{12}$ is independently selected from the group consisting of —H, —(C$_1$-C$_6$)alkyl, -phenyl, -naphthyl; -halogen, and —CN;
$R^{13}$ is -halogen; —(C$_1$-C$_6$)alkyl, -phenyl, or -naphthyl, each of which is unsubstituted or substituted with one or more —(C$_1$-C$_6$)alkyl, -phenyl, or -naphthyl;
$R^{14}$ is as defined above for $R^{13}$ less halogen; and
$R^{15}$ is as defined above for $R^1$;
x is an integer number from 1 to 6.

16. A method for preparing a heterostructured white organic light emitting diode according to claim 15, the method comprising the steps of:
providing a substrate upon having a first electrode on a surface thereof;
providing a hole transport layer on top of the first electrode;
forming an emissive layer on top of the hole transport layer, the emissive layer comprising at least one host material and at least one dopant complex, the dopant complex comprising a transition metal coordinated to two bidentate NO-type ligands or a tetradentate NOON-type ligand;

providing a charge transport layer on top of the emissive layer, and providing a second electrode on top of the charge transport layer.

17. The method of claim 16, wherein M is Pt, $R^5=R^{10}$, $R^4=R^9$, $R^3=R^8$, $R^2=R^7$, and $R^1=R^6$.

18. The method of claim 16, wherein the dopant complex is selected from the group consisting of:

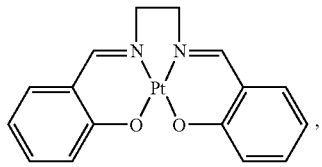
,

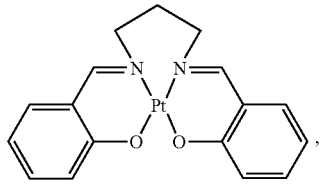
,

-continued

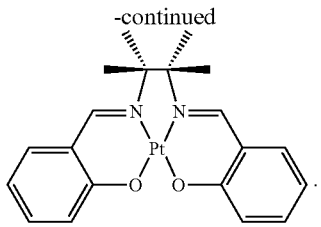
.

and mixtures thereof.

19. The method of claim 16 further comprising the step of changing a color of light generated by the diode by one or more of increasing the concentration of the dopant complex; generating white light with a low concentration of the dopant complex; reducing the range over which light is emitted by the emissive layer; adjusting the concentration of the dopant complex to be within the range from about 2% to about 5% based on the weight of dopant complex and host material; and adjusting the concentration of the dopant complex such that CIE_1931 coordinates of emitted light are substantially x=0.33 and y=0.35 or 0.33.

20. The method of claim 16 further comprising incorporating the organic light emitting diode in a display.

* * * * *